United States Patent

Azdasht et al.

[11] Patent Number: 6,160,218
[45] Date of Patent: Dec. 12, 2000

[54] CHIP HOUSING

[75] Inventors: Ghassem Azdasht, Berlin; Elke Zakel, Falkensee; Herbert Reichl, Berlin, all of Germany

[73] Assignee: Fraunhofer-Gesellschaft zur Förderung der angewandten Forschung e.V, München, Germany

[21] Appl. No.: 08/894,604

[22] PCT Filed: Jan. 12, 1996

[86] PCT No.: PCT/DE96/00058

§ 371 Date: Oct. 6, 1997

§ 102(e) Date: Oct. 6, 1997

[87] PCT Pub. No.: WO96/24162

PCT Pub. Date: Aug. 8, 1996

[30] Foreign Application Priority Data

Feb. 2, 1995 [EP] European Pat. Off. ............... 95101472
Nov. 17, 1995 [DE] Germany ........................... 195 42 883

[51] Int. Cl.[7] ........................................... H05K 5/06
[52] U.S. Cl. ........................... 174/52.3; 257/723; 257/730
[58] Field of Search ................... 174/52.2, 52.3, 174/52.4, 254, 255, 260; 257/730, 723, 724, 725, 685, 686; 361/749

[56] References Cited

U.S. PATENT DOCUMENTS 4,941,033 7/1990 Kishida .................................. 257/698
5,401,688 3/1995 Yamaji et al. .......................... 156/196
5,631,191 5/1997 Durand et al. .......................... 438/119

FOREIGN PATENT DOCUMENTS

WO 90/05379 5/1990 WIPO.

OTHER PUBLICATIONS

Patent Abstracts of Japan, vol. 017, No. 649 (E–1468), Dec. 2, 1993 and JP, A, 05 211275, (Toshiba Corp; Others), Aug. 20, 1993.
Patent Abstracts of Japan, vol. 016, No. 415 (E–1257), Sep. 2, 1992 and JP, 4139737, (Toshiba Lighting & Technol Corp) May 13, 1992.
Patent Abstracts of Japan, vol. 012, No. 239 (E–630), Jul. 7, 1988 and JP, 63029560, (Hitachi Ltd.), Feb. 8, 1988.
Patent Abstracts of Japan, vol. 013, No. 168 (E–747), Apr. 21, 1989 and JP, A, 64 001262, (Hitachi Ltd; Others: 01), Jan. 5, 1989.

*Primary Examiner*—Kristine Kincaid
*Assistant Examiner*—Hung V Ngo
*Attorney, Agent, or Firm*—Darby & Darby

[57] ABSTRACT

A housing to accept at least one electronic component, e.g., a chip with a cover and an opposing cover. The cover and opposing cover are formed to surround the component. On the inner surface of the cover and the opposing cover, there are conductive paths arranged such that the paths on the cover connect terminal areas of the component to the paths on the opposing cover and the paths on the opposing cover open into external terminals of the housing. The cover and/or the opposing cover is/are flexible and are suitable to be interconnected with surrounding sub-housings.

6 Claims, 3 Drawing Sheets

CHIP HOUSING

FIELD OF THE INVENTION

The invention relates to a housing for the accommodation of at least one electronic component, such as a chip or the like, comprising a covering layer and an opposing covering layer which accommodate the electronic component between them. The invention further relates to a process for the production of such a housing.

BACKGROUND OF THE INVENTION

For protection from unintended mechanical and chemical influences, and frequently also for the discharge and distribution of dissipated heat, it is known, in particular in association with chips, to provide these with a screening housing. This housing also offers the advantage that a terminal conductor arrangement extending outwards from the chip terminal surfaces simplifies the implementation of the following connection procedure as, by means of an outwardly fanned configuration of the terminal conductor arrangement of the housing, larger spaces can be provided between the terminal surfaces than is possible with the chip terminal surfaces.

Therefore in the currently widespread surface mounted technology (SMT) it is common practice to accommodate the chip, either alone or together with other electronic components, in a housing made of synthetic resin. In this context it is known to bond the chip onto a frame-like chip carrier and for the complete encapsulation of the chip to fill the chip carrier with a synthetic resin casting compound and enclose the chip therein.

The production of a housing of this type proves costly in practice as, due to the chip carrier's function as frame or form, its design is subject to special requirements. Furthermore the chip, and any other electronic components possibly arranged on the chip carrier, is subject to increased thermal stress when the chip carrier is filled with the synthetic resin casting compound, which not infrequently leads to damage which impairs the function of the electronic component.

OBJECT OF THE INVENTION

Therefore the object of the invention is to propose a housing for electronic components which can be produced substantially non-detrimentally to the respective electronic component(s) and to propose a process which facilitates the production of such a housing with a particularly low outlay.

This object is fulfilled by a housing having the features of claim 1 and by a process for the production of a housing having the features of claim 6.

SUMMARY OF THE INVENTION

In the housing according to the invention both the covering layer and the opposing covering layer are provided with conductor paths on their inner surfaces facing the electronic component, in such manner that the conductor paths of the covering layer connect terminal surfaces of the component to the conductor paths of the opposing covering layer, and the conductor paths of the opposing covering layer lead into outer terminals of the housing, the covering layer and/or opposing covering layer having a flexible carrier layer and being connected to one another in covering layers-connecting zones which surround the component.

Due to the flexible design of at least one covering layer, i.e. the covering layer or opposing covering layer, the electronic component can be hermetically enclosed without the need for casting with a synthetic resin or the like. This also serves to avoid the thermal stress upon the component associated with synthetic resin casting. Additionally, due to the flexible design of a least one covering layer, it is possible to provide an encasing of the component without this involving special requirements of the design of the covering layer or the opposing covering layer. The housing according to the invention also facilitates a production wherein the sealing of the housing takes place virtually in one, process step together with the establishment of the connection between the conductor paths of the covering layer to the conductor paths of the opposing covering layer.

It proves particularly advantageous if the opposing covering layer comprises at least one component-accommodating zone which is recessed relative to the plane of the connecting zones and into which the component, which together with the covering layer forms a component carrier arrangement, engages in such manner that connecting zones of the covering layer and of the opposing covering layer are setback in relation to the central plane of the housing. In this way a housing design can be achieved which is substantially symmetrical relative to the central plane of the housing and which allows an arbitrary arrangement of the housing upon mounting, thus with the covering layer facing upwards or downwards, without thereby changing the spatial requirements for the mounting of the housing.

If the opposing covering layer comprises a plurality of component-accommodating zones spaced by connecting zones, each component-accommodating zone being combined with a component carrier arrangement to form sub-housings, this provides, in a particularly simple manner, for the construction of a housing for a so-called multi-chip-module which allows an arbitrary number of chips, in each case accommodated in a sub-housing, to be combined in a linear arrangement. If moreover both the covering layers and the opposing covering layers of the sub-housings are provided with a flexible carrier layer, in addition to a linear two-dimensional arrangement of the housing it is also possible to obtain a three-dimensional arrangement of the housing wherein for example the sub-housings are arranged in a spiral formation. In this way multi-chip-modules with a particularly high chip density can be produced.

An even further increased chip density in multi-chip modules with individually housed chips can be achieved in the case of a housing arrangement wherein a plurality of the above described housings with linearly arranged sub-housings, or such a housing and a housing according to claim 1 or 2, are arranged one above another, the housings being arranged relative to one another in such manner that in each case the sub-housings of a housing, or a housing, engage into set-back zones, formed by covering layers-connecting zones, between the sub-housings of an adjacent housing. This facilitates, as it were, a toothed arrangement of the housings.

Due to the linear arrangement of the individual sub-housings of a housing, these can be connected to one another in the manner of an electrical series circuit via the conductor paths extending in the connecting zones between the individual sub-housings. If sub-housings arranged one above another, or sub-housings and housings are connected to one another via through-contacts in such manner that the conductor paths of the covering layer of a sub-housing or housing are connected to the conductor paths of the opposing covering layer of the other sub-housing or housing, individual chips accommodated in the sub-housings or housings can also be electrically connected in the manner of an electrical parallel circuit.

The process according to the invention, which facilitates the production of the housing for the accommodation of at least one electronic component, in particular a chip, which housing has been explained in the foregoing in particular in terms of its advantages, comprises the process steps of:

establishing a component/covering layers connection between terminal surfaces of the component and conductor paths of the covering layer to form a component carrier arrangement and establishing a covering layers-connection between the conductor paths of the covering layer and the conductor paths of the opposing covering layer, the covering layer and opposing covering layer being moved towards one another, with their connecting zones, by deformation of the covering layer and/or the opposing covering layer.

The process according to the invention thus facilitates the production of a chip housing with a minimal number of process steps and with no special requirements of the design of the component carrier arrangement. Rather, known connection techniques, such as for example the so-called flip-chip process, can be integrated in a particularly advantageous manner in the process for the production of a chip housing. Thus for example in a first process step the electronic component, for example the chip, can be bonded by its terminal surfaces in a flip-chip process onto the conductor paths of a flexible substrate serving as covering layer. In the second process step the component carrier arrangement formed in this way can then be connected to the opposing covering layer, where again-known connection techniques, such as for example the so-called thermocompression process, can be used.

It proves particularly advantageous if, for establishing the covering layers-connection, conductor paths to be connected to one another are pressed against one another in a contact zone and in the contact zone the covering layer or opposing covering layer is rearwardly acted upon by laser radiation. In this way it is possible for the energy required for the connection of the conductor paths to be introduced as discretely as possible without large-area thermal stress upon the carrier layer of the covering layer or the opposing covering layer.

If, in the case of a transparent carrier layer of the covering layer or opposing covering layer, the transparency of the carrier layer, absorption in the contact zones, and wavelength of the laser radiation are adapted to one another in ouch manner that the laser radiation substantially passes through the carrier layer and is absorbed in the contact zones, a thermal connection of the conductor paths is possible without substantial thermal stress upon the carrier layer of the covering layer or opposing covering layer.

The combination of radiation energy for the thermal treatment of the contact zones with a transparent synthetic material carrier layer, formed for example from polyimide, together with the good absorption properties of the metallic contact zones ensures that the temperature required for the thermal connection is generated only in the connection zone. In this way the hermetic encasing of the chip, formed substantially by the carrier layer of the covering layer or opposing covering layer, is not damaged during the connection process.

It proves particularly advantageous if the laser radiation treatment is carried out using an optical fibre which serves both to introduce the laser radiation into the covering layer or the opposing covering layer and to apply pressure to the conductor paths. When such a variant of the process according to the invention is employed, the process can be implemented with a minimal outlay for the devices required for the implementation of the process.

Another possibility of applying pressure to the contact zones of the conductor paths consists in applying the pressure by means of a pressure die of which a first sub-surface bears against the covering layer, the pressure forces being generated in the regions of the contact zones via a vacuum which is active between a second sub-surface of the pressure die and the opposing covering layer. The vacuum generated for the application of the pressure can also be utilized in a particularly advantageous manner to evacuate the interior of the housing so that it is possible to produce a housing with a particularly space-saving construction adapted to the dimensions of the chip accommodated in the interior.

If, prior to the establishment of the connection between the covering layers, the component carrier arrangement or the opposing covering layer is arranged, with a component zone surrounded by the connecting zone, upon an assembly plane spaced from the plane of the connecting zone, the position of the connection plane of the connecting zones relative to the central plane of the housing can be defined in a manner which appears advantageous for the later mounting of the housing.

A particularly advantageous possibility of fixing the component carrier arrangement or opposing covering layer on the mounting plane consists in the use of a vacuum. Especially in the case of a flexible design of the covering layer or opposing covering layer, the latter can thus particularly easily be brought into a predetermined form.

The possibilities of vacuum fixing on the mounting plane can be utilized particularly effectively if the vacuum fixing is used to fix the opposing covering layer on the mounting plane and following the production of the component carrier arrangement the latter is arranged, with the component, in the component zone of the opposing covering layer, whereupon the covering layers are connected in the connection plane of the connecting zones.

In the event that the above explained production process is to be used for the production of an individual chip housing, it proves advantageous if, following the establishment of the connection between the covering layers, covering layer and opposing covering layer are trimmed in the covering layers-connecting zone using a cutting device. If this cutting device is additionally heated, sealing of the housing can take place simultaneously to the cutting process.

BRIEF DESCRIPTION OF THE DRAWINGS

In the following the housing according to the invention and the process according to the invention, which is particularly suitable for the production of such a housing, will be explained in detail making reference to the drawings in which.

DETAILED DESCRIPTION OF THE INVENTION

Figure 1:
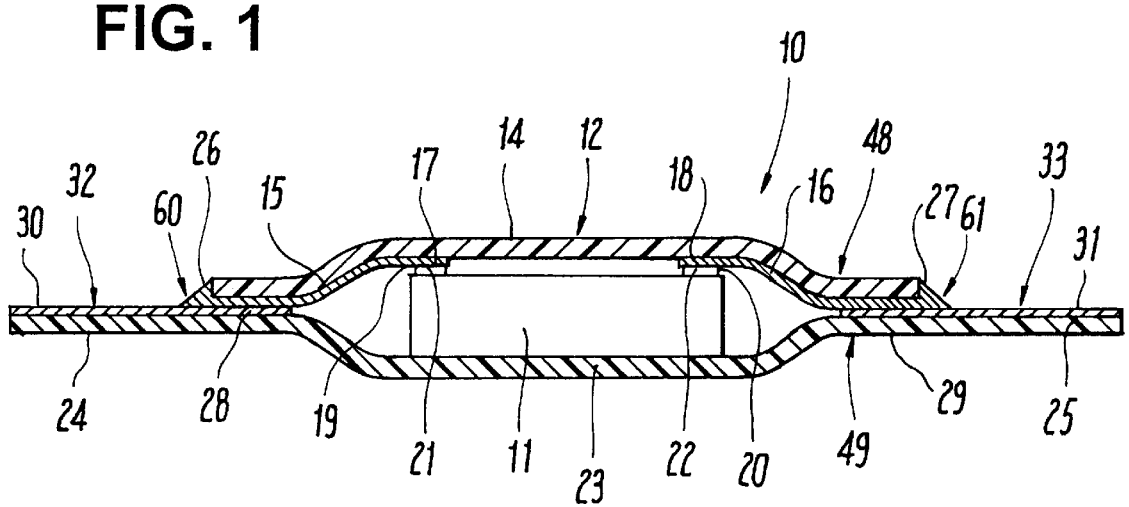
FIG. 1 shows a chip housing in a sectional diagram with a chip arranged between a covering layer and an opposing covering layer.

FIG. 1 illustrates a chip housing 10 with a chip 11 which is accommodated between a covering layer 12 and an opposing covering layer 13. The covering layer 12 has a flexible carrier layer 14 made of transparent synthetic material, for example polyimide, which is provided in known manner with conductor paths 15, 16. The conductor paths 15, 16 are connected via their inner ends 17, 18 to terminal surfaces 21, 22 of the chip provided with elevated contact metallizations 19, 20.

The opposing covering layer 23 likewise has a carrier layer 23 made of a transparent, flexible synthetic material which is provided with conductor paths 24, 25. The conductor paths 15, 16 of the covering layer 12 are connected by their outer ends 26, 27 to inner ends 28, 29 of the conductor paths 24, 25. At their outer ends 30, 31, which are arranged so as to be freely accessible, the conductor paths 24, 25 of the opposing covering layer 13 form outer terminals 32, 33.

To simplify the drawing, FIG. 1 and the following Figures show the chip 11 and the covering layer 12 and opposing covering layer 13 only with two terminal surfaces 21, 22 and in each case two conductor paths 15, 16 and 24, 25, although a plurality of terminal surfaces and a corresponding number of conductor paths can also be provided.

Figure 2:
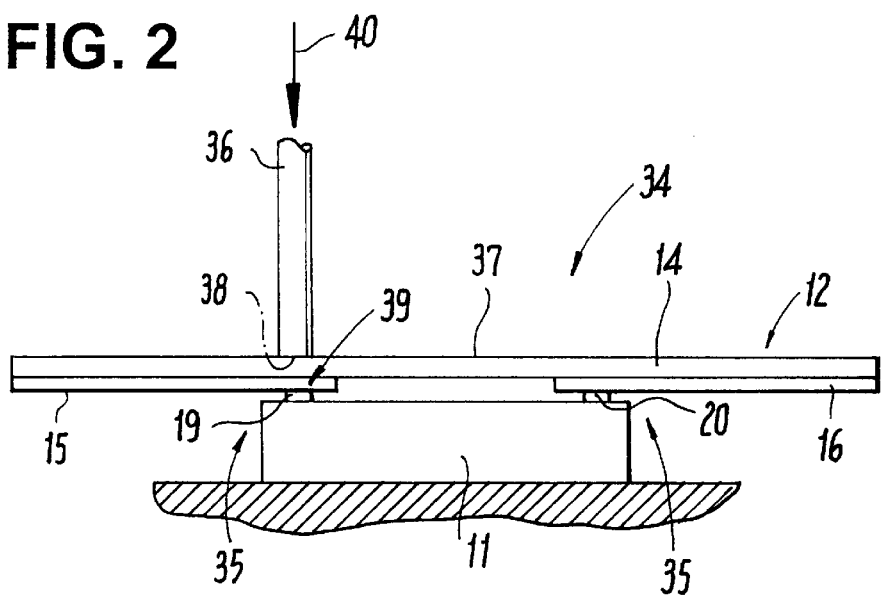
FIG. 2 shows a process for the production of a component carrier arrangement of the chip housing from a covering layer and a chip connected thereto.
Figure 3:
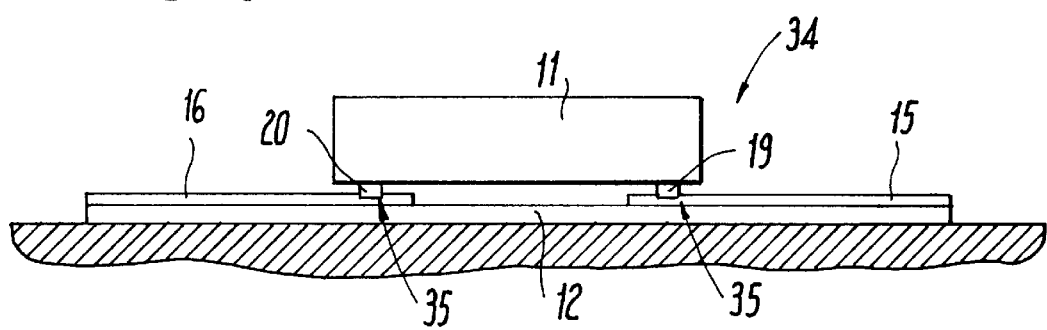
FIG. 3 shows a further process for the production of a component carrier arrangement from a covering layer and a chip connected thereto.

FIGS. 2 and 3 show for example two embodiments whereby, in a first process step for the production of the chip housing 10 illustrated in FIG. 1, a component carrier arrangement 34 comprising the covering layer 12 and chip 11 can be formed. For the establishment of a component/covering layers connection 35 between the conductor paths 15, 16 of the covering layer 12 and the contact metallizations 19, 20 of the chip 11, the process variant illustrated in FIG. 2 employs an optical fibre 36 whose fibre end face 38 is applied onto the rear side 37 of the carrier layer 14 opposite the conductor paths 15, 16. The application location here is selected such that covering with a contact zone 39 between the conductor path 15 or 16 and the contact metallization 19 or 20 results. The connection of the individual conductor paths 15, 16 to the assigned contact metallizations 19 or 20 can take place in a so-called single-point-bonding process wherein the connections between the individual pairs of conductor paths 15 or 16 and contact metallizations 19 or 20 are established consecutively.

For the thermal connection between a conductor path 15 and an assigned contact metallization 19i the covering layer 12, with the fibre end face 38 of the optical fibre 36, is pressed against the chip 11 so that the conductor path 15 and the contact metallization 19 bear against one another without gaps. The application of laser radiation 40 to the covering layer 12 is effected via a laser source (not shown in detail here) which is coupled to the optical fibre 36 and for which, in the case of the described example of a combination of materials, namely polyimide for the carrier layer 14 of the covering layer 12, gold-coated copper for the conductor path 15 and contact metallizations 19, 20 made of a gold/tin alloy, a Nd-YAG laser emitting laser radiation with a wavelength of 1.065 nm is particularly suitable. In relation to this wavelength the polyimide carrier layer 14 has a transmission rate of 88%. A substantial proportion of the non-transmitted radiation is reflected so that only a comparatively small amount of radiation is absorbed. The laser radiation 40 is absorbed substantially in the copper conductor path 15 which heats up accordingly. The above described gap-free coupling of the conductor path 15 to the contact metallization 19 results in a substantially loss-free forward transmission into the contact metallization 19 of the laser energy which has been converted into thermal energy so that the contact metallization is heated to the required melting temperature.

FIG. 3 shows another embodiment for establishing a component/covering layers connection 35 between the chip 11 and the covering layer 12 in order to form the component carrier arrangement 34. Here, as normal in the so-called flip-chip process, the chip 11 with the contact metallizations 19, 20 is applied onto the conductor paths 15, 16 and under thermal influence a connection is established between the chip 11 and the covering layer 12. Compared to the connection technique illustrated in FIG. 2, in the flip-chip process shown in FIG. 3 the chip 11 is subjected to a substantially higher thermal stress.

Figure 4:
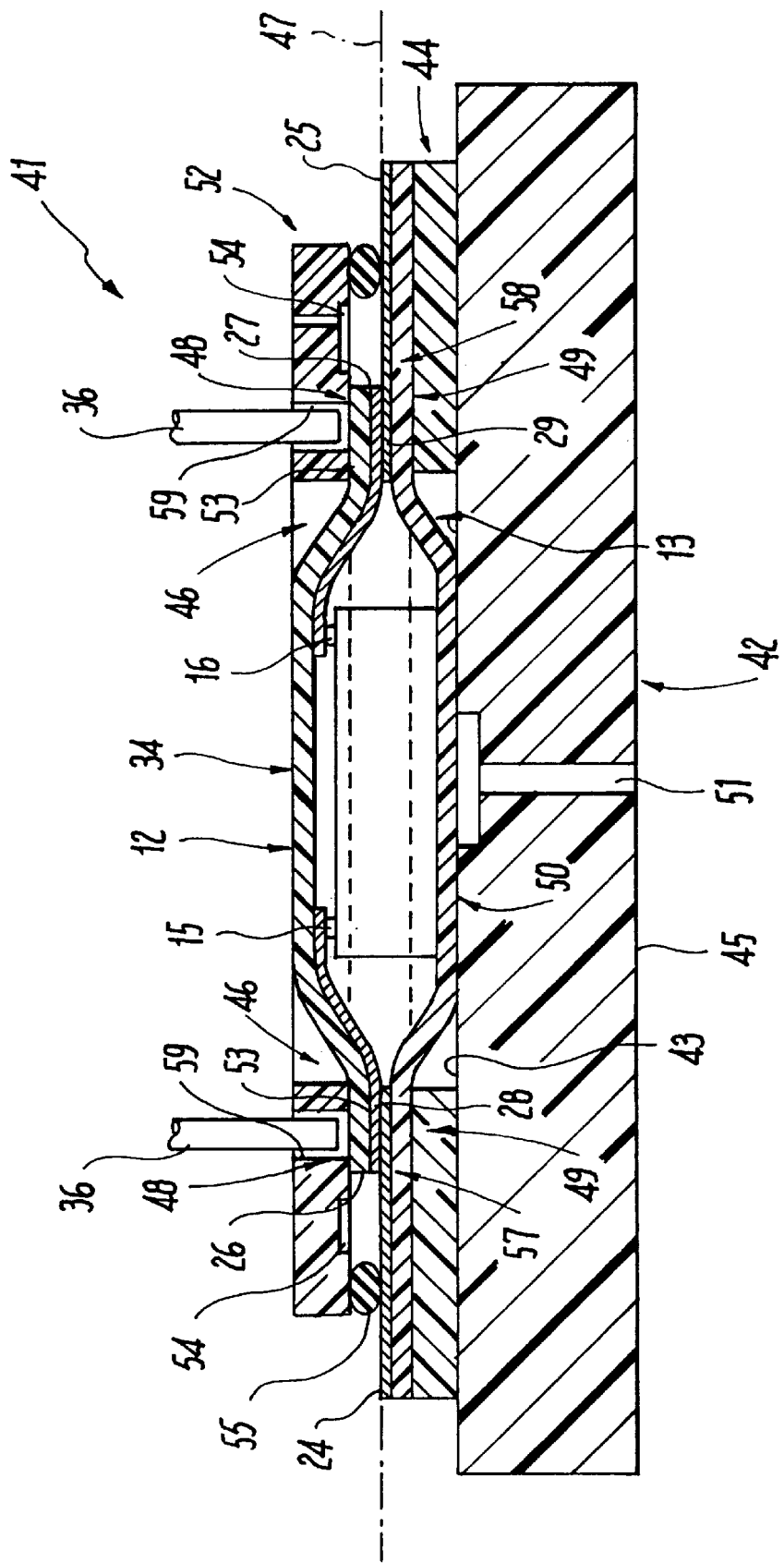
FIG. 4 shows a device for the production of the chip housing illustrated in FIG. 1.

FIG. 4 illustrates the further processing of the component carrier arrangement 34 into the chip housing 10 shown in FIG. 1 in a covering layers-connecting device 41.

In a starting configuration not shown separately here, the covering layers-connecting device 41 comprises an opposing covering layer accommodating device 42 with a mounting plane 43 which is surrounded by a peripheral edge member 44. In the exemplary embodiment of the covering layers-connecting device 41 shown in FIG. 4 the edge member 44 has the form of an independent element connected to a mounting platform 45. The edge member 44 can also however form an integral part of the mounting platform 45.

Prior to the establishment of a covering layers-connection 46 in a connection plane 47 between the connecting zones 48, 49 of the covering layer 12 and opposing covering layer 13, the opposing covering layer 13 is applied to the mounting platform 45 in such manner that the connecting zones 49 of the opposing covering layer 13 come to lie on the edge member 44. For the fixing of the opposing covering layer 13 on the mounting platform 45, a component accommodating zone 50 of the opposing covering layer 13 is rearwardly acted upon by a vacuum via a vacuum bore 51 in the mounting platform 45, in such manner that the component accommodating zone 50 is-caused to bear against the mounting plane 43 of the mounting platform 45. If necessary the edge member 44 can also be provided in parts with vacuum bores (not shown in detail here) to ensure that the connecting zone 49 of the opposing covering layer 13 bears against the edge member 44.

The component carrier arrangement 34, is then combined with the opposing covering layer 13, fixed to the opposing covering layer accommodating device in this way, in such manner that the component carrier arrangement 34, with the chip 11, is inserted into the component accommodating zone 50 of the opposing covering layer 13. For the establishment of a contact between the connecting zone 48 of the covering layer 12 and the connecting zone 49 of the opposing covering layer 13, a pressure die 52, here in the form of a frame, is moved towards the connecting zone 48 of the covering layer 12 in such manner that, as shown in FIG. 4, the connecting zones 48, 49 are arranged in the connection plane 47 bearing against one another. The chip housing 10 thus assumes the form shown in FIG. 4 and FIG. 1.

FIG. 4 shows that only an inner sub-surface 53 of the pressure die 52 bears against the connecting zone 48 of the covering layer 12. In the region of an outer sub-surface 54, the pressure die 52 is spaced from the connecting zone 49 of the opposing covering layer 13 and, supplemented by an O-ring seal 55, encloses a space 56 embracing the connecting, zone 48 of the covering layer 12. A vacuum bore 72 leads into the space 56 so that when vacuum is applied, vacuum forces are active in the space 56 with the result that the sub-Surface 53 of the pressure die 52 presses the connecting zone 48 of the covering layer 12 against the connecting zone 49 of the opposing covering layer 13.

Due to the vacuum effect, the outer ends 26, 27 of the conductor paths 15, 16 of the covering layer 12 are pressed against the inner ends 28, 29 of the conductor paths 24, 25 so that the latter bear against one another without gaps. This satisfies the conditions whereby, as explained in the foregoing in the example of FIG. 2, as a result of the application of laser radiation 40 a thermal connection can occur between the conductor paths 15, 16 of the covering layer 12 and the conductor paths 24, 25 of the opposing covering layer 13 in their contact zones 57 or 58 to form a covering layers-connecting zone 73. Instead of the optical fibres 36 shown in FIG. 4, which via bores 59 facilitate the application of energy to the conductor paths 15, 16 and 24, 25 in their contact zones 57, 58, the laser treatment can also be effected by means of a suitable focusing optical device as, by virtue of the pressure forces transmitted by the pressure die 52 to the connecting zones 48, 49, no pressure forces need be transmitted via the fibre end faces 38 of the optical fibres 36.

Particularly suitable for use as opposing covering layer 13 is a flexible sheet having a copper metallization for the formation of the conductor paths 24, 25. It has proved particularly advantageous if these conductor paths are preliminarily zinc-plated with a coating of an eutectic zinc/lead alloy having a thickness of approximately 10 $\mu$m. As explained in the foregoing, the conductor paths 15, 16 of the covering layer 12 can be formed from a copper metallization with a gold coating, for example in a thickness of 0.5 $\mu$m. In the case of a chip housing 10 produced in tests, the centre distance between the outer terminals 32, 33 amounted to 400 $\mu$m. The optical fibre 36 selected for the tests had a core diameter of 600 $\mu$m. The laser treatment took place with a powder of 10 W and a pulse length of 40 ms. Here the pressure force on the fibre end face 38 amounted to approximately 40 cN. The above described connection technique was performed at room temperature and without the use of fluxing agents. It has proved that by maintaining the temperature of the mounting platform 45 at 100° C. a laser power of 8 W is also sufficient.

Following the completion of the covering layers-connection 46 between the covering layer 12 and the opposing covering layer 13, the chip housing 10 illustrated in FIGS. 1 and 4 can be provided at the peripheral edge 60 of the connecting zone 48 of the covering layer 12 with a sealing compound 61 (FIG. 1) in order to hermetically seal the chip 11 from the environment.

Figure 5:
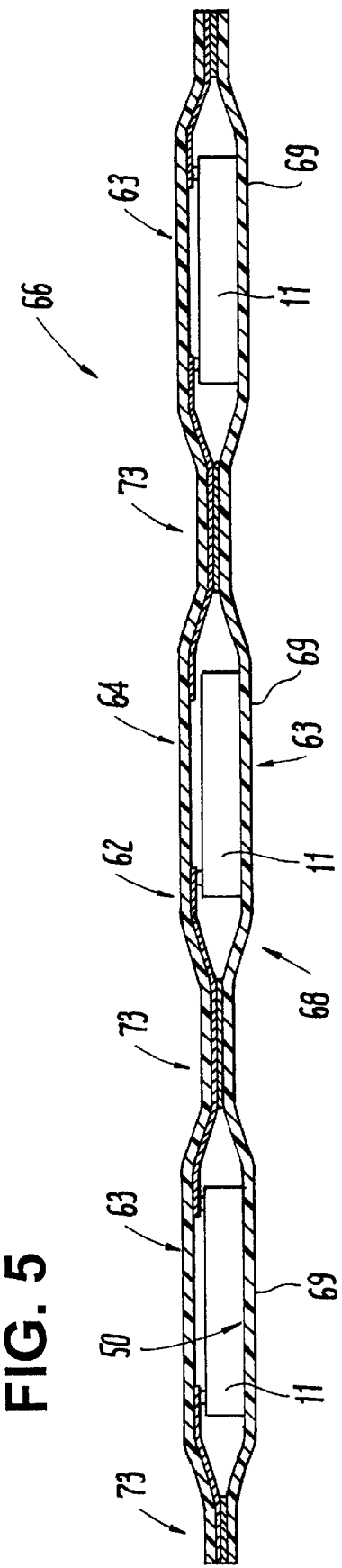
FIG. 5 shows a chip housing with a plurality of sub-housings for the construction of a multi-chip module.
Figure 6:
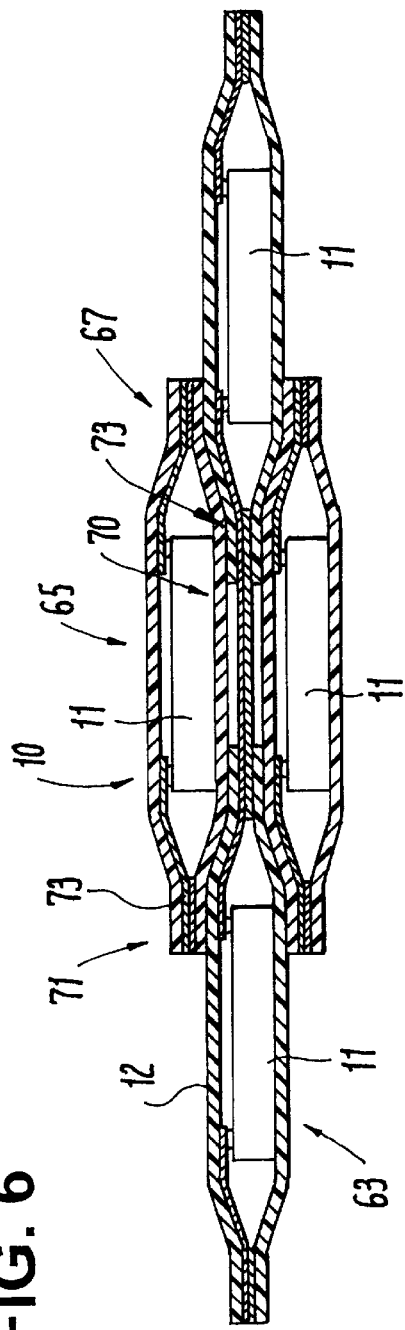
FIG. 6 shows a further chip housing with a plurality of sub-housings for the construction of a multi-chip module.

FIGS. 5 and 6 illustrate, with reference to two exemplary embodiments how, with the aid of chip housings 10 designed as individual housings and chip housings 62 comprising a plurality of sub-housings 63, housing arrangements 64 (FIG. 5) and 65 (FIG. 6) can be used to form multi-chip modules 66 and 67.

FIG. 5 illustrates the multi-chip module 66 with a linear housing arrangement 64 wherein the individual sub-housings 63 are connected to one another in arrow via the covering layers-connecting zones 73. The electrical connection between the chips 11 accommodated in the individual sub-housings 63 takes place via the conductor paths 24, 25 in the covering layers-connecting zones.73.

An opposing covering layer 68 comprising a plurality of subsidiary opposing covering layers 69, interconnected via the connecting zones 49 and designed in accordance with the opposing covering layer 13 shown in FIG. 4, can be used to produce the housing arrangement 64 illustrated in FIG. 5. Then, as explained in detail with reference to FIG. 4, the chips 11 of the individual component carrier arrangements 34 can be inserted into the individual component accommodating zones 50 of the subsidiary opposing covering layers 69. The component carrier arrangements can also be continuous and connected as one unit to the opposing covering layer.

Finally FIG. 6 shows the housing arrangement 65 for the formation of the multi-chip module 67. In contrast to the housing arrangement 64 illustrated in FIG. 5, the housing arrangement 65 has a multi-layer structure with sub-housings 63 and chip housings 10 superimposed in offset fashion. Here the housings 10 engage into setback zones 70 formed by the covering layers-connecting zones 73 of the sub-housings 63. In order also to facilitate an electrical connection of the chips 11, superimposed in offset fashion, in overlap zones 71 between covering layers-connecting zones 73 and covering layers 12 there can be provided through-contacts (not shown in detail here) which interconnect the conductor paths 24, 25 and 15, 16 of chip housings 10 and/or sub-housings 63 superimposed in offset fashion.

What is claimed is:

1. A housing for accommodating at least one electronic component, the housing comprising:

a cover layer and an opposing cover layer;

the cover layer having an inner surface and comprises a pair of upper conductor paths disposed along the inner surface;

the opposing cover layer having an inner surface and comprises a pair of lower conductor paths having outer terminals disposed along the inner surface;

at least one electronic component having terminal surfaces;

the pair of upper conductor paths of the cover layer being designed to connect to the terminal surfaces of the component and to the pair of lower conductor paths of the opposing cover layer, which lead to the outer terminals;

wherein the cover layer and the opposing cover layer each has a flexible carrier layer and is formed such that the cover layer and the opposing cover layer are connected directly to one another via their respective conductor paths facing each other in covering layers-connecting zones which surround the component.

2. A housing for accommodating at least one electronic component having terminal surfaces, the housing comprising:

a cover layer including a first flexible carrier layer having an inner surface and first conductor paths disposed on the inner surface of the first flexible carrier layer, the cover layer and the component forming a component carrier arrangement; and an opposing cover layer including a second flexible carrier layer having an inner surface, and second conductor paths disposed on the inner surface of the second carrier layer and having outer terminals; the cover layer and opposing cover layer accommodating the component therebetween; the conductor paths of the cover layer being connected to the terminal surfaces of the component and to the conductor paths of the opposing cover layer; the first conductor paths of the cover layer and the second conductor paths of the opposing cover layer being directly connected to one another at covering layers-connecting zones with the electronic component disposed between the covering layers-connecting zones.

3. The housing according to claim 2, wherein the opposing cover layer comprises at least one component-accommodating zone which is offset relative to a connection plane defined along the connecting zones of the cover layer and opposing cover layer, the component is disposed in and engages the at least one component-accommodating zone so that the connecting zones of the covering layer and the opposing cover layer are set back relative to a central plane of the housing.

4. The housing according to claim 2, wherein the opposing cover layer has a plurality of component-accommodating zones separated by connecting said zones, each component-accommodating zone together with the component carrier arrangement form a sub-housing.

5. A housing arrangement for accommodating a plurality of electronic components each having terminal surfaces, the housing arrangement comprising:

a plurality of sub-housings, each sub-housing comprising:

a cover layer including a first flexible carrier layer having an inner surface and first conductor paths disposed on the inner surface of the first flexible carrier layer, the cover layer and one of the component forming a component carrier arrangement; and an opposing cover layer including a second flexible carrier layer having an inner surface, and second conductor paths disposed on the inner surface of the second carrier layer and having outer terminals; the cover layer and opposing cover layer accommodating the component therebetween; the conductor paths of the cover layer being connected to the terminal surfaces of the component and to the conductor paths of the opposing cover layer; the first conductor paths of the cover layer and the second conductor paths of the opposing cover layer being directly connected to one another at covering layers-connecting zones with the electronic component disposed between the covering layers-connecting zones; each of the plural sub-housings being joined to another one of said sub-housings via one of the covering layers-connecting zones.

6. The housing arrangement according to claim 5, wherein one of the plurality of electronic components associated with one of said sub-housings is electrically connected to another of the plurality of electronic components associated with another one of said sub-housings via through-contacts so that the conductor paths of the cover layer of the one sub-housing are connected to the conductor paths of the opposing cover layer of the other sub-housing.

* * * * *